United States Patent
Liu et al.

(10) Patent No.: US 6,451,703 B1
(45) Date of Patent: Sep. 17, 2002

(54) MAGNETICALLY ENHANCED PLASMA ETCH PROCESS USING A HEAVY FLUOROCARBON ETCHING GAS

(75) Inventors: Jingbao Liu, Sunnyvale, CA (US); Takehiko Komatsu, Chiba (JP); Hongqing Shan, Cupertino, CA (US); Keji Horioka, Mihama (JP); Bryan Y Pu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/522,374

(22) Filed: Mar. 10, 2000

(51) Int. Cl.$^7$ .............................................. H01L 21/302
(52) U.S. Cl. ...................... 438/710; 438/711; 438/714; 438/723
(58) Field of Search .................. 438/710, 711, 438/714, 723

(56) References Cited

U.S. PATENT DOCUMENTS

| | | | | |
|---|---|---|---|---|
| 5,300,460 A | * | 4/1994 | Collins et al. ............. | 437/225 |
| 5,338,399 A | * | 8/1994 | Yanagida et al. .......... | 156/662 |
| 5,366,590 A | | 11/1994 | Kadomura ................. | 156/662 |
| 5,707,486 A | * | 1/1998 | Collins ..................... | 156/643.1 |
| 5,770,098 A | * | 6/1998 | Araki et al. ................ | 216/67 |
| 6,069,092 A | * | 5/2000 | Imani et al. .............. | 438/723 |
| 6,159,862 A | * | 12/2000 | Yamada et al. ............ | 438/712 |

FOREIGN PATENT DOCUMENTS

| | | |
|---|---|---|
| EP | 1 041 613 | 12/1998 |
| EP | 1 041 613 | * 10/2000 |
| JP | 57-108267 | 7/1982 |
| JP | 57-155732 | 9/1982 |
| JP | 4-346428 | * 12/1992 |
| JP | 9-191002 | * 7/1997 |
| JP | 11-219942 | * 8/1999 |
| WO | WO 99/34419 | * 7/1999 |
| WO | WO 00/30168 | * 5/2000 |

OTHER PUBLICATIONS

International Search Report (PCT/US 01/40277).

* cited by examiner

Primary Examiner—Benjamin L. Utech
Assistant Examiner—Charlotte A. Brown
(74) Attorney, Agent, or Firm—Charles S. Guenzer; Joseph Bach

(57) ABSTRACT

An oxide etch process practiced in magnetically enhanced reactive ion etch (MERIE) plasma reactor. The etching gas includes approximately equal amounts of a hydrogen-free fluorocarbon, most preferably $C_4F_6$, and oxygen and a much larger amount of argon diluent gas. The magnetic field is preferably maintained above about 50 gauss and the pressure at 40 milliTorr or above with chamber residence times of less than 70 milliseconds. A two-step process may be used for etching holes with very high aspect ratios. In the second step, the magnetic filed and the oxygen flow are reduced. Other fluorocarbons may be substituted which have F/C ratios of less than 2 and more preferably no more than 1.6 or 1.5.

47 Claims, 4 Drawing Sheets

MAGNETICALLY ENHANCED PLASMA ETCH PROCESS USING A HEAVY FLUOROCARBON ETCHING GAS

FIELD OF THE INVENTION

The invention relates generally to plasma etching. In particular, the invention relates to a method of etching oxide layers in semiconductor integrated circuits with a magnetically enhanced plasma etch reactor.

BACKGROUND ART

Modern silicon integrated circuits contain millions to tens of millions of interconnected semiconductor devices. Such a high level of integration has been achieved, at least in part, by decreasing the minimum feature sizes and by providing multiple wiring layers of horizontally extending metallization lines. Dielectric layers separate the wiring layers, which are selectively connected with small-area vertical metallization interconnects. In the case of a dielectric layer separating two metallization layers, the vertical interconnect is called a via when it makes the connection between these metallization layers. However, the vertical interconnect is called a contact hole when it connects the first metallization layer to the semiconductor devices built on the silicon substrate. This invention will be primarily described with respect to the formation of the via or contact holes by dry plasma etching. After such holes are etched, they are filled with a metallization, such as tungsten, thereby forming the vertical connection.

As will be explained below, etching of the via or contact holes is presenting increasing difficulty in advanced structures because of their decreasing widths and increasing aspect ratios. Since this invention is applicable to both via and contact etches (and other dielectric etch applications), the terms "via" and "contact" may be used nearly interchangeably in the following text hereafter without distinguishing specialized portions of the process specific to one or the other.

The inter-level dielectric has conventionally been composed of a silica-based oxide, whether it is silicon dioxide grown in a plasma CVD process using TEOS, or a borophosphate silicate glass (BPSG) deposited as a spin on glass, or other dielectric materials. More recently, low-k dielectric materials have been developed for use as inter-level dielectrics. Their lower dielectric constants offer the possibility of reduced capacitive coupling between horizontally or vertically adjacent lines, thus reducing cross talk, power consumption, and signal rise time. Low-k dielectrics have been proposed having varying compositions, some silicon-based, and other carbon-based.

A typical advanced via hole is illustrated in the cross-sectional view of FIG. 1. A lower dielectric layer 10 includes a metal feature 12, such as a metallization line for the underlying layer 10. An upper dielectric layer 14 is deposited on the lower dielectric layer 10 and the metal feature 12. A step of chemical mechanical polishing (CMP) may be used to planarize the top surface of the dielectric layer 14. A photoresist layer 16 is spun onto the upper dielectric layer 14 and dried, and photographic means are used to expose and develop a photomask aperture in the area overlying the metal feature 12 in which the via is to be formed. The original upper profile of the patterned photoresist prior to etching is shown by line 16'. A plasma etching step uses the patterned photoresist layer as a photomask to etch through the dielectric layer 14 to the underlying metal feature 12 to form a via hole 20. The step of etching the dielectric is usually referred to as oxide etching.

After the formation of the via hole 20, the photoresist is stripped, and metal is deposited into the via hole 20. The structure may be more complicated than that illustrated depending upon the special needs of different device manufacturers. The metal feature 12 may be a line rising above the dielectric layer 14 or may be a dual-damascene structure combining in the dielectric a horizontal trench and a connected vertical via. An etch stop layer may be formed between the lower and upper dielectric layer 10, 14 to allow the etching step to stop on the etch stop layer without sputtering the underlying metal. For fluorine-based plasma etching of silica, silicon nitride is a good etch stop layer. An anti-reflection coating may be formed between the upper dielectric layer 14 and the photoresist layer 16 to aid the resolution of the photographic step used in the patterning the photomask. These additional structural features are well known in the art. Their etching is typically performed in steps separate from the dielectric etching, and an integrated etching process needs to be developed to combine the different etching steps. The invention is primarily concerned with the dielectric etching, which presents the most formidable challenges.

The thickness of the dielectric layer 14 is generally in the range of 0.7 to 1.4 $\mu$m. This thickness is not expected to decrease in advanced devices. The larger thicknesses including multiple depths of via holes are usually associated with more complex metallization structures, which offer increased device density with fewer processing steps. Via widths for chips under commercial development now may be as small as 0.18 $\mu$m. Technology for 0.13 $\mu$m widths is being developed. Widths of 0.10 $\mu$m are expected in the not too distant future.

These increasingly small widths present etching problems, particularly in view of the dielectric thickness remaining essentially constant. The via holes 20 have increasingly high aspect ratios. The aspect ratio of a via hole is the ratio between the depth of the hole to the narrowest dimension of the hole in its upper portion. At the present time, aspect ratios of 4 or 5 are found in advanced chips. In future chips, the aspect ratio will increase to 8 or 10. Such high aspect ratios present a significant challenge to oxide etching because they require a highly anisotropic etch that reaches deeply into the hole. Etching of high aspect-ratio holes also requires higher etch selectivity to photoresist due to the reduction in the oxide etch rate at greater depths in the holes. The selectivity and anisotropy required in the oxide etch has been typically accomplished using a fluorocarbon plasma chemistry which deposits a protective polymer over non-oxide materials and all vertical sidewalls. On the other hand, the combination of the fluorine plasma and underlying oxygen in the presence of energetic ion bombardment breaks down the polymer that formed at the bottom of the silica hole being etched and exposes the underlying silica to the etchant that turns it into volatile components which are pumped out from the hole, thereby etching the hole. However, if too much polymer is formed, the hole nonetheless becomes plugged with polymer and etching stops before the bottom of the hole is reached. No amount of further etching under the same conditions is effective at completing the etching process. This deleterious result is called etch stop.

The photolithography needed for such narrow features typically relies upon deep ultra-violet (DUV) light. Photoresists are available which are sensitive to DUV radiation. The thickness of the photoresist must be limited to little more than the minimum hole width. Otherwise, the photolithography becomes defocussed over the depth of the photoresist. However, photoresist is usually a carbon-based polymer that is prone to some degree of etching by most etch chemistries. As a result, the depth of the photoresist decreases from the original profile 16' shown in FIG. 1 to profile 16. Furthermore, in most etching chemistries, exposed corners are etched more quickly than planar surfaces so that the most severe selectivity problem is often manifested in facets 22 forming at the upper corners of the photoresist layer 16 around the patterned hole in the photomask. Etching of polymeric materials such as photoresist tends to produce facets that are much more curved than illustrated. A photoresist etching margin is given by the remaining height 24 on the sidewall of the photoresist 16 next to the patterned via hole 20. If the facets 22 reach the underlying upper dielectric layer 14, that is, the photoresist etching margin reaches zero, the critical dimension (CD) associated with the photomask is lost, and the upper portions of the via hole 20 become flared.

A further problem with low photoresist selectivity, particularly around the facets 22, is that high-energy particles sputter the photoresist, and the sputtered photoresist material is likely to redeposit on the upper sidewalls of the via. Such non-uniformly redeposited photoresist makes it difficult to control of the hole profile. For these reasons, the selectivity of the oxide etch relative to the photoresist must be kept high, and the most critical photoresist selectivity is that associated with the facets.

Photoresist selectivity has always been a concern in oxide etching, but nitride selectivity has usually been a greater concern. However, it appears that for very narrow structures, the photoresist selectivity will be the most difficult requirement imposed on the oxide etch.

Recent developments have shown that a fluorocarbon plasma can etch holes in oxide with aspect ratios up to about 5:1 with very high selectivity to nitride. Hung et al. have disclosed a particularly advantageous etching recipe in U.S. patent application, Ser. No. 09/276,311, filed Mar. 25, 1999, incorporated herein by reference in its entirety. This patent application discloses the advantage of using a heavy hydrogen-free fluorocarbon with a low-F/C ratio, such as hexafluorobutadiene ($C_4F_6$), as the active etchant species, in combination with a larger fraction of a carrier gas. Argon is the conventional carrier gas for plasma etching, but Hung et al. in U.S. patent applications, Ser. Nos. 09/276,376, filed Mar. 25, 1999 and Ser. No. 09/405,869, filed Sep. 24, 1999 have disclosed that even better nitride selectivity without etch stop is obtained if xenon is used as the carrier gas in combination with fluorocarbons such as $C_4F_6$. These patents are also incorporated herein by reference in their entireties.

The chemistry presented in the patents has been primarily developed on the IPS Etch Reactor, available from Applied Materials, Inc. of Santa Clara, Calif. The IPS reactor is a high-density plasma reactor using an inductively coupled plasma source to generate a high-density plasma (HDP), which is defined as one having an ionization density of at least $10^{11} cm^{-3}$ over the entire region of the plasma excluding the plasma sheath. In the IPS reactor, the RF inductive coil is primarily responsible for generating the plasma while another RF power supply applied to the pedestal electrode controls the DC self-bias voltage, thereby controlling the energy of the ions accelerated across the plasma sheath to the wafer. However, a desire still exists for performing oxide etching in more conventional capacitively coupled plasma etch reactors, often referred to as diode reactors. HDP reactors have only recently been developed and are still relatively expensive. Further, the high-density plasmas have the ability to create damage in semiconductor chips, for example, by charging the dielectric. While these damage mechanisms can usually be controlled in HDP reactors, they are much less of a problem in capacitively coupled reactors producing a lower plasma density.

An example of capacitively coupled etch reactor is the magnetically enhanced reactive ion etch (MERIE) reactor 30 schematically illustrated in FIG. 2. This illustration is based on the MxP, eMax, or Super-e etch reactors available from Applied Materials. It includes a grounded vacuum chamber 32, perhaps including liners to protect the walls. A wafer 34 is inserted into the chamber 32 through a slit valve opening 36 and placed on a cathode pedestal 38 with an electrostatic chuck 40 selectively clamping the wafer. The chuck powering is not illustrated. Unillustrated fluid cooling channels through the pedestal 38 maintain the pedestal at reduced temperatures. A thermal transfer gas such as helium is supplied to unillustrated grooves in the upper surface of the pedestal 38. The thermal transfer gas increases the efficiency of thermal coupling between the pedestal 38 and the wafer 34, which is held against the pedestal 38 by the electrostatic chuck 40 or an alternatively used peripheral wafer clamp.

An RF power supply 42, preferably operating at 13.56 MHz, is connected to the cathode pedestal 38 and provides the only significant power for generating the plasma while also controlling the DC self-bias. Magnetic coils 44 powered by unillustrated current supplies surround the chamber 32 and generate a slowly rotating (on the order of seconds and typically less than 10 ms), horizontal, essentially DC magnetic field in order to increase the density of the plasma. A vacuum pump system 46 pumps the chamber 32 through an adjustable throttle valve 48. Shields 50, 52 not only protect the chamber 32 and pedestal 38 but also define a baffle 54 and a pumping channel 54 connected to the throttle valve 48.

Processing gases are supplied from gas sources 58, 60, 62 through respective mass flow controllers 64, 66, 68 to a quartz gas distribution plate 70 positioned in the roof of the chamber 32 overlying the wafer 34 and separated from it across a processing region 72. The composition of the etching gas is a subject matter of one aspect of the present invention. The distribution plate 70 includes a manifold 74 receiving the processing gas and communicating with the processing region 72 through a showerhead having a large number of distributed apertures 76 so as to inject a more uniform flow of processing gas into the processing region 72.

The '311 patent application discloses some preliminary results using $C_4F_6$ for etching oxide in a magnetically enhanced reactive ion etcher (MERIE), such as the MxP, eMax, or Super-e reactors. The favored recipe includes only $C_4F_6$ and large amounts of argon, but further work is deemed to be necessary to obtain a production worthy recipe and yet better performance.

SUMMARY OF THE INVENTION

The invention includes a process for etching dielectric oxides in a capacitively coupled plasma etch reactor using a heavy fluorocarbon such as hexafluorobutadiene ($C_4F_6$), oxygen, and a substantial fraction of a carrier gas, preferably argon. Carbon dioxide (CO) may additionally be added. The process is capable of providing high selectivity for etching oxide relative to photoresist and is thus particularly useful for etching very high aspect-ratio holes. The fluorocarbon is preferably hydrogen-free and has a low F/C ratio of less than 2, more preferably no more than 1.6 and most preferably no more than 1.5.

The invention also includes decreasing the magnetic field as the etched hole is deepening. It further includes decreasing the amount of oxygen relative to the fluorocarbon. The capability of this process to control the composition and conformal deposition of the polymer not only improves the profile control for high aspect ratio holes, but also the selectivities to the underlayers that made of materials other than $SiO_2$, such as $Si_3N_4$, polysilicon, and metal silicide. This wide range of the plasma composition produced hereby is therefore suitable to all critical dielectric, such as SAC and dual damascene.

DETAILED DESCRIPTION OF THE PREFERRED EMBODIMENTS

Figure 1:
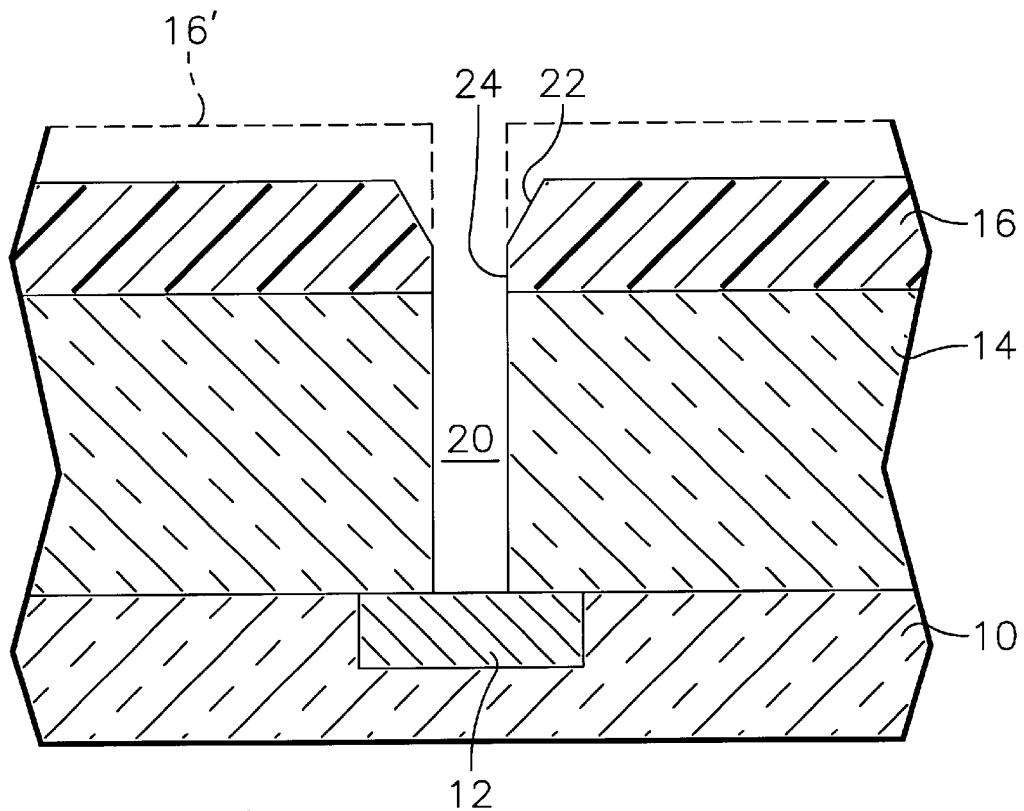
FIG. 1 is a cross-sectional view of a high aspect-ratio via hole.
Figure 3:
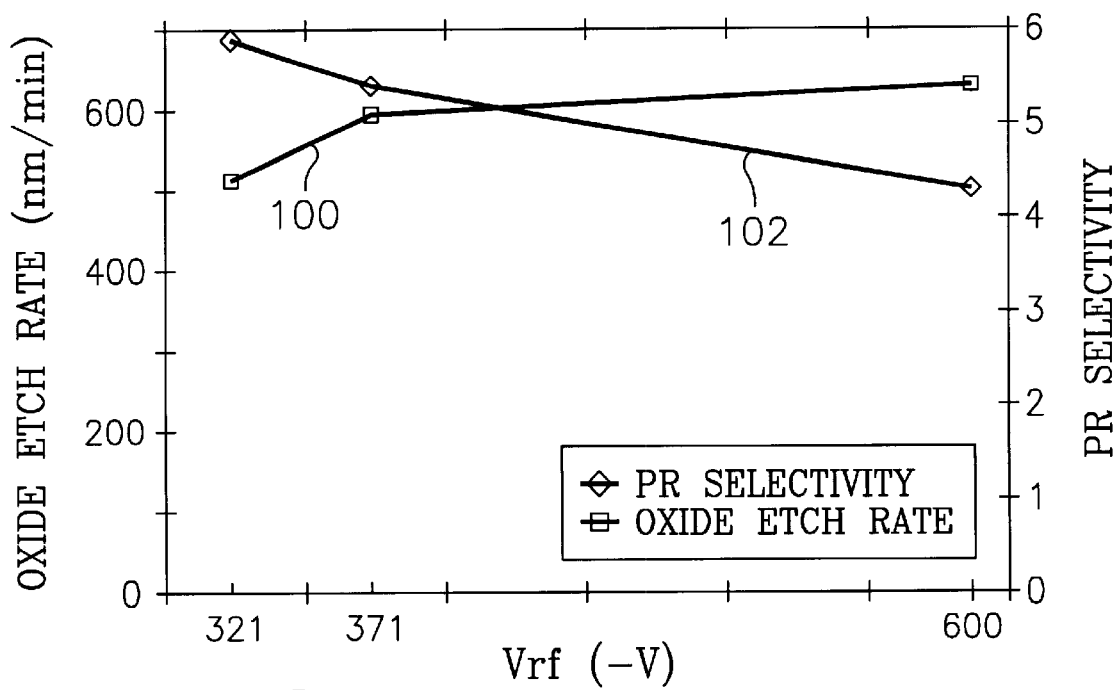
FIGS. 3 through 7 are graphs illustrating the dependences of the oxide etch rate and the photoresist selectivity upon, in the respective figures, the DC self-bias, the reactant residence time, the magnetic field, the RF power, and the chamber pressure.
Figure 2:
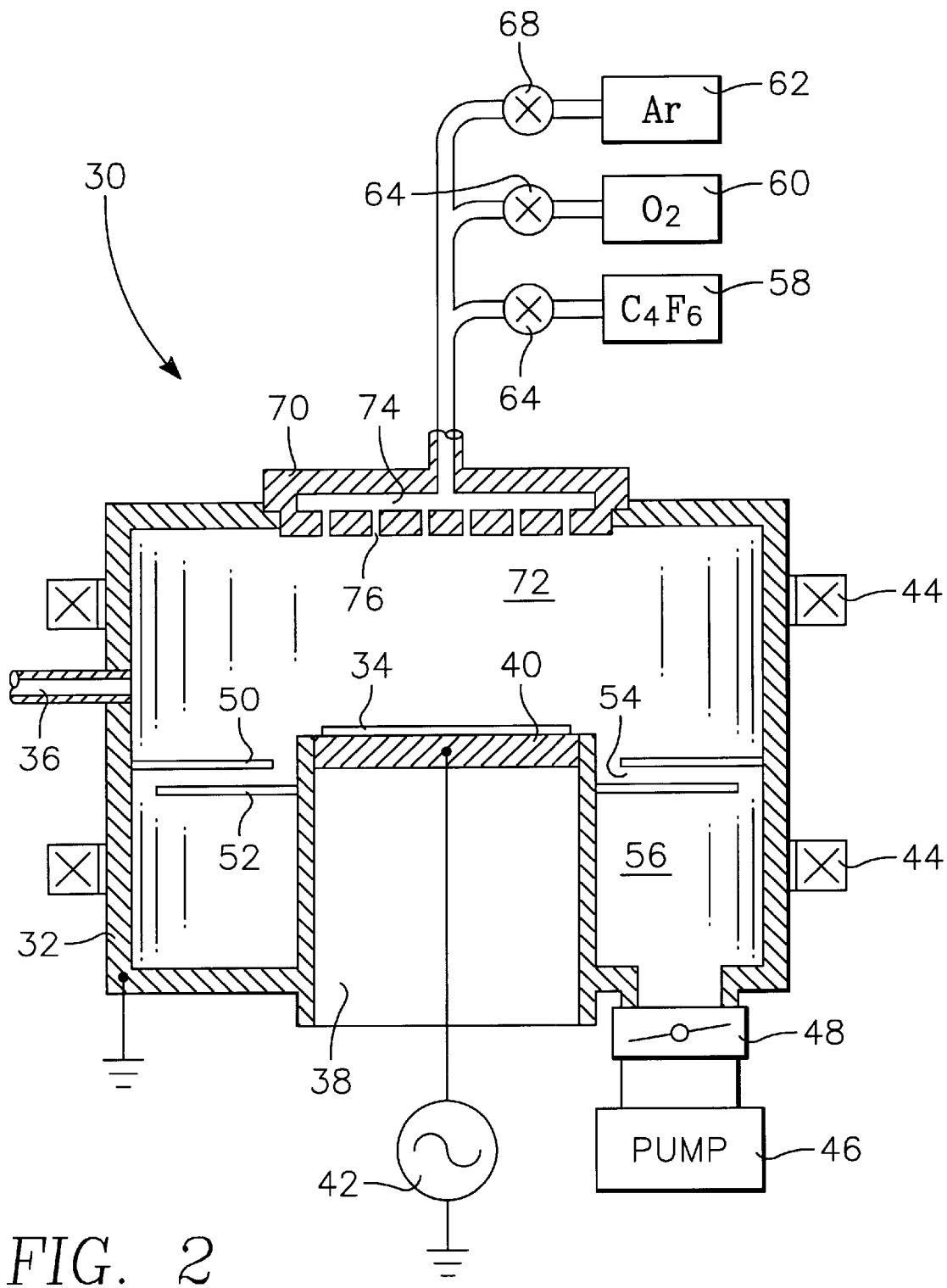
FIG. 2 is a schematic illustration of a magnetically enhanced capacitively coupled plasma etch reactor.

The formation of polymeric layers in fluorocarbon etching of holes in oxide has been long recognized as important for an anisotropic etch producing a vertical profile and for selectively etching oxide relative to non-oxide materials including photoresist, nitrides, and silicon. For via and other holes having very high aspect ratios, it becomes crucial to closely control the degree of polymerization and the composition of the polymer. While too little polymerization will degrade protection to the sidewall and selectivity to photoresist, nitride, and other non-oxide materials, a slight excess of polymerization in very high aspect-ratio holes will cause etch stop towards the bottom of the hole. The carbon concentration in the polymer will impact its resistance to being etched by the plasma and the conformality of its deposition. Higher plasma resistance of the polymer increases photoresist selectivity, while conformal deposition of the polymer helps to control the profile of the high aspect ratio hole etch. The F/C ratio, which is the ratio of fluorine to carbon atoms in a fluorocarbon molecule, and the molecular bonding structure, which is the way these F and C atoms bond together, are crucial for controlling polymerization and the properties of the polymer. A high F/C ratio indicates a strongly etching gas while a low F/C ratio usually results in extensive polymerization. The bonding structure will, in turn, determine the process condition required to generate the plasma with a more desirable radical type and density. The advantage of a superior bonding structure and a low F/C ratio of hydrogen-free fluorocarbon $C_xF_y$ with y/x<2, more preferably y/x≦1.6, and most preferably y/x≦1.5 adequately allows the polymerization to be controlled within the above mentioned narrow polymerization window for advanced applications.

Octafluorocyclobutane ($C_4F_8$) is a popular oxide etching gas but fails to meet the maximum preferred value of the F/C ratio. Octafluoropentadiene ($C_5F_8$) meets the more preferred F/C ratio. Hexafluorobutadiene ($C_4F_6$) is the most preferred fluorocarbon, but other isomers of $C_4F_6$ are known. Hexafluorobenzene ($C_6F_6$) has an even lower F/C ratio but is difficult to work with because of its high boiling point and high liquid viscosity.

In order to achieve this controllability through controlled polymerization, it is often desirable to combine the beneficial effects of a low-F/C fluorocarbon and a high carrier gas fraction with a polymer-oxidizing gas, such as gaseous oxygen ($O_2$) or carbon monoxide (CO). Of these two, oxygen is greatly preferred because carbon monoxide complicates the control of the F/C ratio in the plasma, tends to produce a more complex polymer, and is considered toxic and corrosive. Since hydrogen is also polymerizing and complicates the plasma chemistry, it is usually desired to use hydrogen-free fluorocarbons.

The advantages of these low F/C-ratio $C_xF_y$ gases are realized in a low or medium density plasma due to the unique dissociation pattern of heavy, hydrogen-free, fluorocarbon gases in this plasma density range. We believe that the lower plasma density ($10^9$ to $10^{11}/cm^3$) associated with capacitively coupled etch reactors, such as those used for magnetically enhanced reactive ion etching (MERIE), has advantages for obtaining better photoresist selectivity than that available with high-density plasma (HDP) etch reactors. In a high-density plasma, which has a very high dissociation rate, the fluorocarbon process gas is quickly dissociated into smaller fractions of the feed gas with a high concentration of free fluorine radicals F* that have a very high etching strength to both oxide and photoresist, and therefore a low photoresist selectivity. The excess free fluorine can only be consumed by the etching process, whether of the oxide or photoresist, or by controllable scavenging by chamber parts, typically composed of heated silicon. The controllability of this scavenging is limited by the range of process parameters and part materials and usually results in a trade-off against the cost of consumables. Also, a high-density plasma tends to produce hot electrons, and those escaping the plasma are likely to implant themselves well within the insulative photoresist, thereby negatively charging it. The trapped negative charge then accelerates the positively charged ions from the plasma to the photoresist. Such high-energy ions will sputter the photoresist. On the other hand, MERIE plasmas tend to produce a significantly lower electron temperature, thereby reducing the charging effect.

The unique property of etching gases with these low F/C ratios allows relatively high magnetic field to be used without greatly altering the gas dissociation pattern. This enables the magnetic field to be used as an independent knob to adjust process conditions with minimum impact on polymerization formation. It is known that the magnetic field impressed in a MERIE etcher increases the plasma ionization density to within the range of $10^9$ to somewhat less than $10^{11} cm^{-3}$. The magnetic field increases the plasma density without increasing the DC bias such as would occur if increasing RF power were used to increase the plasma density. The magnetic field also strongly influences the process gas cracking sequence and therefore the final plasma composition. The magnetic field also makes it possible to run the process using a higher RF power for higher oxide etch rate without sacrificing a reasonably low DC bias. Increased magnetic field has the effect of reducing the DC self-bias on the pedestal, and thus reducing the ion bombardment energy. The effect is complicated and involves the interaction of the magnetic and electric fields. Fundamentally, the magnetic field more closely confines the plasma and increases its density. The higher plasma density impresses more current in the equivalent electrical circuit of the plasma for a fixed input power and thus reduces the sheath voltage. That is, the high plasma density reduces the self-bias voltage. The reduced DC bias reduces the photoresist corner loss catalyzed by high-energy ion bombardment and therefore increases the photoresist selectivity with respect to the facet.

On the other hand, it is believed that reducing the magnetic field near the bottom of the via is advantageous in creating a more anisotropic etch at that location. Deep, narrow vias tend to taper inwardly towards their bottoms due to lack of ion bombardment resulting in thicker build up of sidewall polymer. The more intense ion bombardment from a lower magnetic field or higher DC bias can make the bottom portion of the contact hole more vertical. Lower magnetic field will also reduce electron-charge damage induced by non-uniform instantaneous magnetic field.

The variable magnetic field provided by a magnetic field induced by an electrical coil rather than permanent magnets allows superior adjustability of the magnetic field strength to be used as an effective process tuning knob for controlling the plasma composition by controlling the degree of dissociation. A wider range of tunability of all of the process parameters is achieved by maintaining the plasma density between $10^9$ to $10^{11}/cm^3$ with the desired plasma composition for high aspect-ratio contact and via etch and various other special applications. For example, high magnetic field can be used at the beginning portion of the via hole etch to maintain high oxide etch rate and high photoresist selectivity. The magnetic field strength can then be turned down or even turned off in the ending step of the process to achieve vertical profile at bottom of the hole, or better bottom CD, and low electron charge damage for logical device process.

Residence time of the etching gas within the plasma etching chamber is an additional process knob for controlling the plasma composition. The optimized residence time range is believed to be critical in achieving the desired plasma composition. We also believe that a short residence time of the etchant gas within the plasma is desirable. When a heavy hydrogen-free fluorocarbon molecule such as $C_4F_6$ enters a plasma, it is progressively cracked into yet smaller entities. During shorter residence times, there is a larger fraction of the fluorocarbon radical $CF_x^*$ while, at longer residence times, there is a larger fraction of the isolated fluorine radical $F^*$. We believe that an excessive amount of the fluorine radical attacks the photoresist while an equal amount of a fluorocarbon radical offers some polymerization protection to the photoresist. The residence time $\tau_{RES}$ can be approximately represented by $$\tau_{RES} \propto PV/F,$$

where P is the chamber pressure, V is chamber volume, and F is the total reactant flow. Decreased residence times require increased pumping capacities of the vacuum system. Large flows of inert carrier gas such as argon may be used to adjust the residence time. A high flow of inert carrier gas, for example, greater than ten times that of the reactive gases, facilitates polymer control with a large process window, and most importantly, helps to control the location of polymer deposition and balances the right amount polymer on the top photoresist surface and the sidewall of the sharply vertical oxide feature.

Based upon the above described concepts, this invention utilizes the intrinsic advantage of these low F/C-ratio gases, combines the superior working conditions, including proper plasma density, adjustable magnetic field, and short residence time provided by an advanced MERIE chamber to tune the plasma composition and thus to obtain desirable polymerization for various critical dielectric etch applications.

For etching high aspect-ratio (HAR) holes with optimized process condition, these low F/C-ratio gases provide a plasma to generate polymeric coating with outstanding plasma resistance, which in turn protects the photoresist from being etched too quickly. High photoresist selectivity is thereby achieved. The unique plasma composition also provides a lower photoresist etch rate under conditions producing no polymer deposition. The controllability of the plasma composition obtained by adjusting the $C_xF_y/O_2$ ratio, and therefore the degree of polymerization as polymer formation by the fluorocarbon is balanced by polymer removal by oxygen, achieves better profile control and increased intervals between chamber cleaning, in particular, the mean wafers between wet clean (MWBWC). In addition, the plasma contains less free fluorine, which in turn renders the etch process less sensitive to the exact composition of the film being etched. Therefore, less tuning is required between doped and undoped dielectric films.

When extremely high photoresist selectivity is required, carbon monoxide (CO) may be included as a gas additive to produce plasmas with even higher carbon concentrations as the fluorine is removed as COF and therefore to achieve a higher degree of polymerization. Due to the important role that oxygen plays in the plasma, a high selectivity of etching oxide versus nitride can be achieved based on utilization of the oxygen provided locally from the oxide film.

Low DC bias can be used in the presence of magnetic fields greater than 35 or 50 gauss. This low ion bombardment energy in the low-bias process contributes to a high photoresist selectivity measured on the facets of the post-etch photoresist. This variation of the magnetic field at the final steps of the etch process is also a knob for bottom CD control. Optimized pressure and flow also improve bottom CD control. By optimizing the gas flows and pressure of the process, the plasma composition, specifically the concentration of the fluoromethane radicals $CF_x^*$, with x=1, 2 or 3, can be tuned to achieve the optimized ratio of radicals which benefit the etch profile control especially the bottom CD. Optimized pressure and flow also improve the micro-loading performance. Normal and reverse micro-loading can be achieved upon suitably tuning the flow and pressure, and the two can be balanced to obtain the minimum micro-loading point. The tuning permits high RF power to be used in a process having a large process window. The dissociation pattern of the low F/C-ratio gases is relatively independent of the RF power applied. This allows a high RF power to be used with minimum impact on the other aspects of wafer processing. The higher power results in higher etch rate and therefore wafer throughput with minimum trade off to the photoresist selectivity.

Based on these observations, a recipe for etching high respect-ratio contact holes in oxide has been developed and is summarized in TABLE 1.

TABLE 1

| | |
|---|---:|
| $C_4F_6$ Flow (sccm) | 30 |
| $O_2$ Flow (sccm) | 18 |
| Ar Flow (sccm) | 700 |
| Bias Power (W) | 2000 |
| Magnetic Field (G) | 100 |
| Pressure (mT) | 40 |
| Cathode Temp. (° C.) | −20 |
| Backside He Pressure (T) | 20 |
| Time (s) | 220 |

An important feature of this recipe is characterized by the ratio of the gas flow of oxygen relative to that of the heavy fluorocarbon $C_4F_6$. The ratio can be varied dependent on the composition of the oxide film being etched, and two or more steps with different oxygen flow rates can be used for different features of the contact holes. For example, as the effective aspect ratio changes as the etch progresses, the oxygen fraction can increase. Another important factor in this recipe is the flow of the inactive diluent gas argon relative to that of $C_4F_6$. An amount of argon at least 10 times that of the heavy fluorocarbon, preferably at least 20 times will also help increase the etch stop margin. Argon of more than 100 times the heavy fluorocarbon seems unnecessary.

This recipe was used to a high aspect-ratio hole having a width of 0.17 $\mu$m in a BPSG oxide layer of thickness 2.0 $\mu$m, that is, an aspect ratio of 12:1. The recipe produces a BPSG etch rate of 0.75 $\mu$m/min and a photoresist selectivity of greater than 10:1. The photoresist selectivity is measured as the ratio of (1) the oxide thickness etched through plus a distance correspond to the over-etch time used to (2) the depth of the lower photoresist facet corner (0.28 $\mu$m, in this case) from the original photoresist surface (0.6 $\mu$m, in this case). The profile of the hole, measured by the tilting angle of the side wall, is 89.5° with a resultant bottom CD of 0.14 $\mu$m.

A similar recipe was developed for a yet narrower via hole having a photo masking width of 0.1 $\mu$m over 0.82 $\mu$m of TEOS oxide, resulting in an aspect ratio of 8:1. The recipe is summarized in TABLE 2.

TABLE 2

| | |
|---|---|
| $C_4F_6$ Flow (sccm) | 30 |
| $O_2$ Flow (sccm) | 23 |
| Ar Flow (sccm) | 700 |
| Bias Power (W) | 2000 |
| Magnetic Field (G) | 100 |
| Pressure (mT) | 40 |
| Cathode Temp. (° C.) | −20 |
| Backside He Pressure (T) | 20 |
| Time (s) | 120 |

This recipe uses more oxygen than does the previous recipe because of the difference in film composition. The etch rate in this case was relatively low (>0.4 $\mu$m/min) due to both a smaller hole size and that TEOS film is harder to etch than is a BPSG film. The relatively low etch rate also leads to the relatively low photoresist selectivity of ~5:1. A contact hole profile angle of 89.4° is achieved resulting in a bottom CD of 0.08 $\mu$m. Thus, the recipe can be adapted to very small feature sizes, but at reduced values of oxide etch rate and photoresist selectivity.

In some cases, usually when the aspect ratio is relatively high (7 to 8:1 or above) and the horizontal feature size is relatively large (0.35 $\mu$m or above), two or more recipe steps may be needed to have better control of the hole profile. One example is given below in TABLE 3.

TABLE 3

| | Step 1 | Step 2 |
|---|---|---|
| $C_4F_6$ Flow (sccm) | 28 | 28 |
| $O_2$ Flow (sccm) | 24 | 20 |
| Ar Flow (sccm) | 500 | 500 |
| Bias Power (W) | 1800 | 1800 |
| Magnetic Field (G) | 100 | 50 |
| Pressure (mT) | 40 | 40 |
| Cathode Temp. (° C.) | −20 | −20 |
| Backside He Pressure (T) | 20 | 20 |
| Time (s) | 180 | 120 |

The oxygen flow in the second step is lower than that in the first step. This reduction produces the higher polymerization needed to enhance the side wall protection when the hole becomes deeper, thus reducing the bowing profile of the hole. Due to the reduced-oxygen step, the oxygen flow in the first step can be slightly increased from which it can used in a single-step recipe without unduly sacrificing the overall photoresist selectivity. The high-oxygen first step also reduces the polymer built up at the neck of the contact hole (the section right below the photoresist/oxide interface) and therefore further aids profile control. As a result, this two-step recipe achieves a sharper profile than a single-step etch recipe. In a particular case, this recipe was used to etch 0.35 $\mu$m-diameter contact holes on 2.8 $\mu$m-thick TEOS film. An overall etch rate of 0.65 to 0.7 $\mu$m/min is obtained with a photoresist selectivity of about 5:1. A bottom CD of 0.29 $\mu$m is obtained with a sidewall profile angle of 98.4°.

The second step of the recipe of TABLE 3 is distinguished from the first step also by a lower magnetic field. As discussed before, this helps to increase the bottom CD (less tapering) by increasing the effective DC bias applied to the wafer, thereby increasing the ion bombardment energy at the bottom of the hole. This particular recipe was also run on wafers with silicon nitride film formed between the oxide film and the silicon substrate at the bottom of the contact holes. No visible nitride loss is observed after more than 20% over etch, indicating excellent nitride selectivity of the recipe.

All the above recipes have similarly characterized etching gas compositions. The amount of oxygen is approximately equal to or somewhat less than the amount of hexafluorobutadiene. Dependent upon other conditions, an $O_2$—to—$C_4F_6$ ratio of between 0.4:1 and 2:1, more preferably between 0.5:1 and 1.2.1, should produce many of the same beneficial effects. The flow of argon relative to that of hexafluorobutadiene is high, at least ten times greater and preferably twenty times greater. Although CO can be added in some situations, advantageously it is not required for present structures. That is, an etching gas mixture may be used which contains essentially no carbon monoxide.

Systematic studies were pursued based upon a general recipe developed earlier than those of the first three recipes presented above. The general recipe is summarized in TABLE 4. The trends and windows are expected to be quite similar.

TABLE 4

| | |
|---|---|
| $C_4F_6$ Flow (sccm) | 23 |
| $O_2$ Flow (sccm) | 18 |
| Ar Flow (sccm) | 500 |
| Bias Power (W) | 1800 |
| Magnetic Field (G) | 100 |
| Pressure (mT) | 40 |
| Cathode Temp. (° C.) | −20 |
| Backside He Pressure (T) | 20 |
| Time (s) | 240 |

Both the oxide etch rate and the photoresist selectivity show countervailing trends dependent upon a number of processing parameters. Some variations show little effect while others show significant trends, some having optimum values in the middle of the tested ranges.

Figure 4:
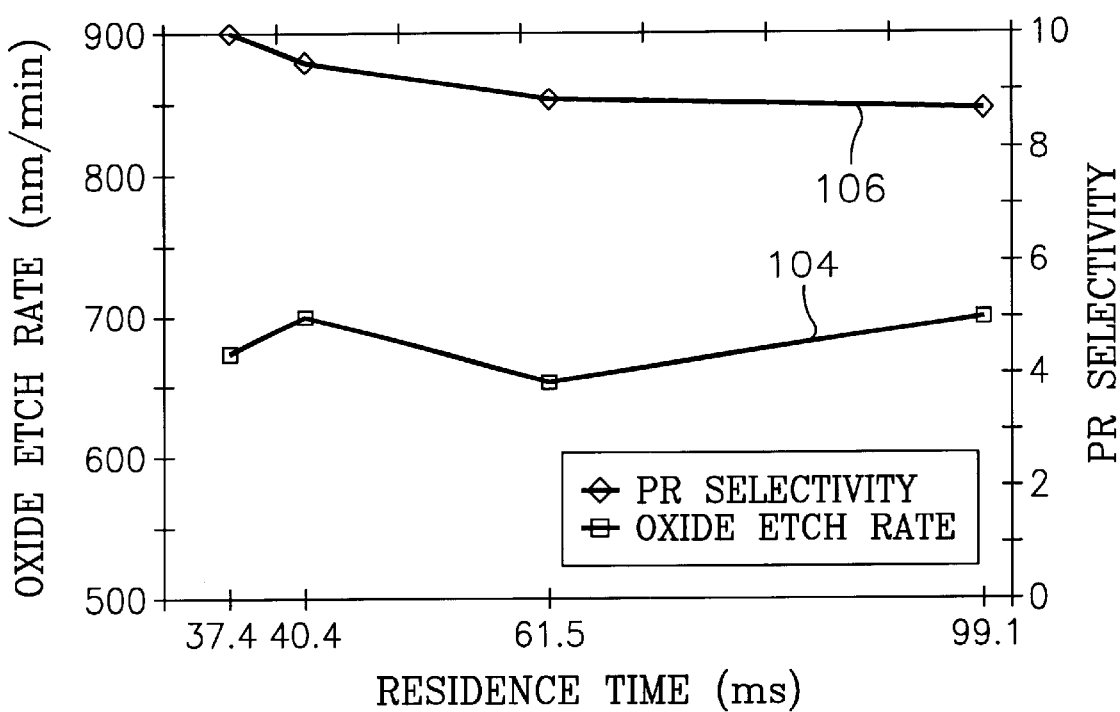

The dependence of oxide etch rate and photoresist selectivity upon residence time are graphed in FIG. 4. For these data and the recipes presented above, the chamber volume is 25 liter though the plasma volume is estimated to be 10.6 liters, and the vacuum pumping speed is about 1300 liters/sec. The oxide etch rate is given by line 104, and the photoresist selectivity by line 106. At residence times between about 37 and 100 ms, the oxide etch rate does not vary in a clear fashion although there seems to be reduced etch rate below 40 ms. However, the photoresist selectivity decreases from about 10:1 at a residence time of 37 ms to about 8.5:1 at 61 ms. Further increases in residence time only slightly decrease the photoresist selectivity. These results show that a residence time of less than 70 ms provides good photoresist selectivity. A residence time of 50 ms or less is even better. However, further reductions in residence time to below 30 ms depress the photoresist selectivity, most likely due to a DC bias increase resulting from a drop in pressure relative to that used to achieve the residence time set point.

Figure 5:
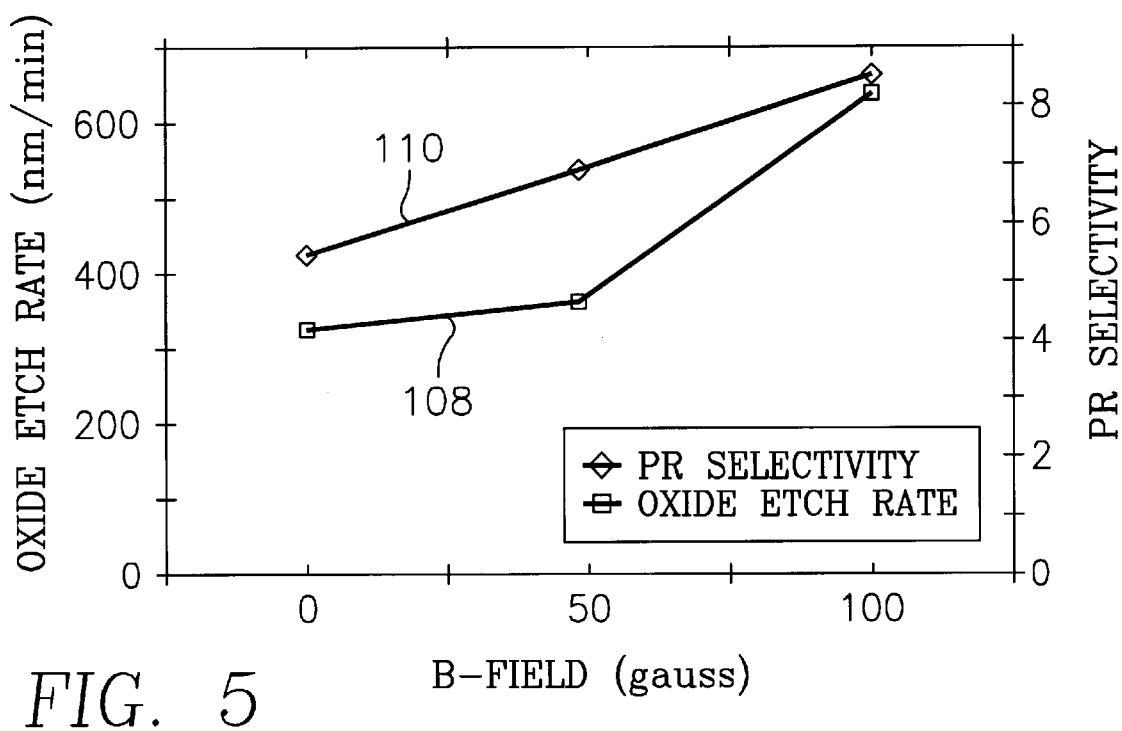

The dependence of oxide etch rate and photoresist selectivity upon the magnetic field intensities are graphed in FIG. 5, line 108 showing the dependence of the oxide etch rate and line 110 showing the dependence of the photoresist selectivity. The etch rate significantly increases above 50 gauss. The photoresist selectivity shows a nearly proportional increase with the magnetic field, with values greater than 50 gauss being preferred. The increased etch rate increase is considered to be due to an increase of the plasma density by increasing the magnetic field while the increase in photoresist selectivity is from the lower DC bias resulting from the higher magnetic field. These results can be somewhat generalized to a minimum magnetic field of 35 gauss.

Figure 6:
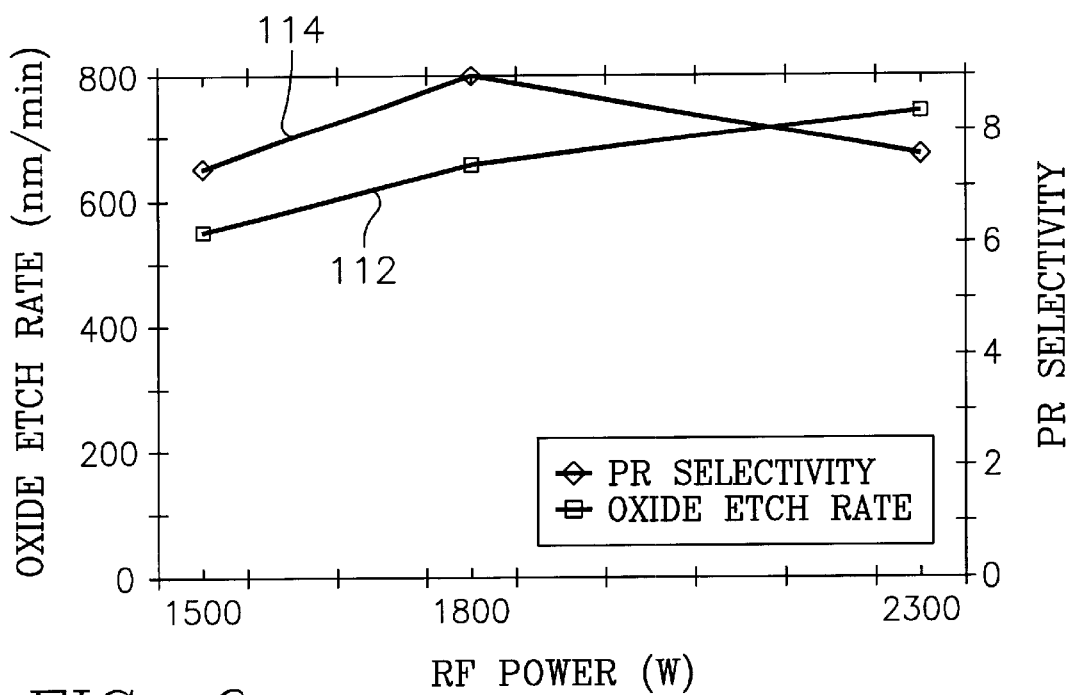

The dependence upon the level of RF power is graphed in FIG. 6. The results for the oxide etch rate are given by line 112; the results for the photoresist selectivity by line 114. As expected, the oxide etch rate increases with RF power. However, the photoresist selectivity peaks at around 1800W. This is because of the RF power has positive impact on the both plasma density and DC bias, which in turn, increase the etch rate on both oxide and photoresist. A Furthermore, this impact is reduced on oxide but increased on photoresist when RF power continues to increase. Some variation about this peak is expected, for example, varying according to the different dielectric films to be etched. A preferred range of RF power for maximizing photoresist selectivity extends from 1650 to 2100W for a 200-mm diameter wafer. Powers generally scale as the area of the wafer.

Figure 7:
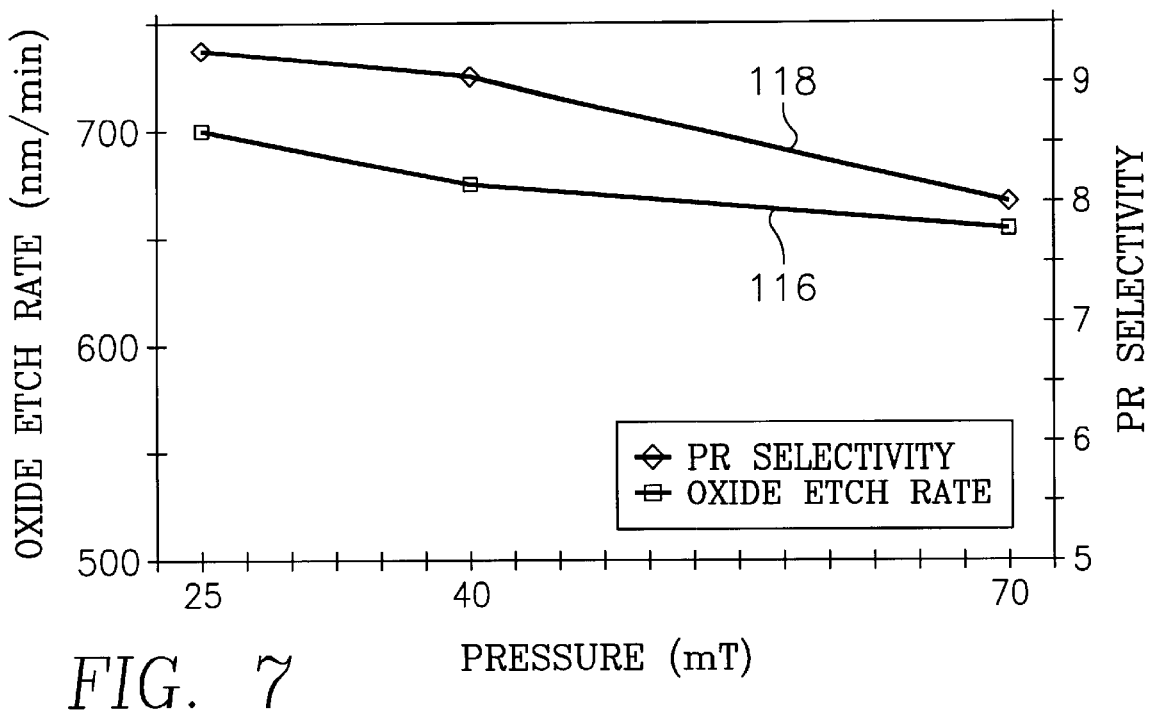

The corresponding results upon varying the chamber pressure are graphed in FIG. 7. The oxide etch rate is given by line 116 in the graph of FIG. 5, and the photoresist selectivity by line 118. The oxide etch rate decreases from about 0.7 $\mu$m/min at 25 milliTorr to a about 0.62 $\mu$m at 70 milliTorr while the photoresist selectivity decreases from about 9.3 to 8 over the same range. Clearly, operation at the lower pressure is desired for both oxide etch rate and photoresist selectivity. Again, some variation is expected. For high oxide etch rate, the chamber pressure should be no more than 40 milliTorr with no known lower limit in the range tested. For high photoresist selectivity, the chamber pressure should also be no more than 40 milliTorr, but an undetermined lower limit exists at which PR selectivity drops. As mentioned before, the residence times are reduced for low chamber pressure. The lower limit on chamber pressure is determined by the pumping speed of the vacuum system, especially as here, where the etchant flow is relatively high.

Attempts have been made to optimize a etching recipe for an MERIE reactor based on $C_4F_8$ as the fluorocarbon to achieve similarly good results. Those efforts have succeeded only in part. The best recipes have required the use of CO. The oxide etch rates obtained with $C_4F_8$ are as good as those with $C_4F_6$. However, the photoresist selectivity, particularly at the facets, is significantly poorer. For these reasons, it is believed that $C_4F_6$ is the much better fluorocarbon for use in a capacitively coupled reactor, especially for high aspect-ratio holes for which photoresist selectivity is so crucial.

It is believed that the beneficial results obtained with $C_4F_6$ relative to $C_4F_8$ arise from its producing a more carbon-rich polymer. The extra carbon is available because $C_4F_6$ has an F/C ratio of 1.5, compared to 2.0 for $C_4F_8$. Other hydrogen-free fluorocarbons have similarly advantageous F/C ratios, most of the usable ones having at least four carbon atoms. There are several other isomers of $C_4F_6$, for example, hexafluorocyclobutane or perfluorobutyne. Octafluoropentadiene ($C_5F_8$) and perfluorobenzene ($C_6F_6$) having respective F/C ratios of 1.6 and 1.0 have been proposed for oxide etching although not in the recipe regimes disclosed above. The addition of one hydrogen atom, which is strongly polymerizing, to the heavy fluorocarbon should have little effect if a low F/C ratio is still obtained. Although a carbon-rich polymer is advantageous for nitride selectivity and sidewall protection, it is particularly advantageous for photoresist selectivity. The carbon-rich polymer mimics the photoresist and may result in an effective thickening of the photoresist with no loss in photoresist resolution. Photoresist faceting is still likely to occur, but for the combined thickness of photoresist and polymer, thereby increasing the effective photoresist selectivity.

The recipes presented above all use argon as the chemically inactive diluent gas. Even better results are anticipated if xenon is used instead. However, xenon is an expensive gas and in short supply. Thus, argon is preferred if a satisfactory recipe is available. It is anticipated that xenon may be used for the most critical applications, for example, the first-level (contact) inter-level etch with argon being used for the somewhat less demanding upper-level (via) etches.

Although the above description has emphasized the advantages of the disclosed recipes in terms of high photoresist selectivity, such recipes are usable in applications not requiring such photoresist selectivity, for example, if a nitride or other hard mask overlies the oxide and it photo-lithographically patterned with a different etching recipe than that used for the oxide.

What is claimed is:

1. A method for etching an oxide layer with increased selectivity to photoresist, comprising the steps of:

providing a magnetically enhanced plasma etch reactor chamber having a pedestal electrode supporting a substrate having said oxide layer to be etched;

flowing into said chamber an etching gas mixture comprising (a) hexafluorobutadiene, (b) oxygen, and (c) a chemically inactive carrier gas selected from the group consisting of argon and xenon and containing essentially no carbon monoxide;

applying a magnetic field substantially parallel to said pedestal electrode; and applying RF electrical power to said pedestal electrode to provide the only significant power to excite said etching gas mixture into a plasma to thereby etch a hole into said oxide layer defined by a patterned photomask comprising photoresist overlying said oxide layer with an etching selectivity to a facet of said photoresist of at least 5:1.

2. A method for etching an oxide layer with increased selectivity to photoresist, comprising the steps of:

providing a magnetically enhanced plasma etch reactor chamber having a pedestal electrode supporting a substrate having said oxide layer to be etched in opposition to a showerhead and further including at least one magnetic coil positioned on a side of said showerhead towards said pedestal electrodes;

flowing through said showerhead into said chamber an etching gas mixture comprising (a) a fluorocarbon having at least four carbon atoms and an F/C ratio of less than 2, (b) oxygen, and (c) a chemically inactive carrier gas selected from the group consisting of argon and xenon;

applying a magnetic field substantially parallel to said pedestal electrode by powering said at least one magnetic coil; and applying RF electrical power to said pedestal electrode to excite said etching gas mixture into a plasma to thereby etch a hole into said oxide layer defined by a patterned photomask comprising photoresist overlying said oxide layer with an etching selectivity to a facet of said photoresist of at least 5:1;

wherein in a first step said magnetic field is applied to a first field strength and wherein in a second step said magnetic field is applied to a second field strength less than said first field strength.

3. The method of claim 1, wherein a ratio of a flow of said oxygen to a flow of said hexafluorobutadiene is between 0.4:1 and 2:1.

4. The method of claim 2, wherein said fluorocarbon has an F/C ratio of no more than 1.6.

5. The method of claim 4, said fluorocarbon comprises $C_4F_6$.

6. The method of claim 1, wherein a second ratio of a flow of said carrier gas to a flow of said hexafluorobutadiene is at least 10.

7. A method for etching an oxide layer with increased selectivity to photoresist, comprising the steps of:

providing a magnetically enhanced plasma etch reactor chamber having a pedestal electrode supporting a substrate having said oxide layer to be etched;

flowing into said chamber an etching gas mixture comprising (a) a fluorocarbon having at least four carbon atoms and an F/C ratio of less than 2, (b) oxygen, and (c) a chemically inactive carrier gas selected from the group consisting of argon and xenon;

applying a magnetic field substantially parallel to said pedestal electrode; and applying RF electrical power to said pedestal electrode to excite said etching gas mixture into a plasma to thereby etch a hole into said oxide layer defined by a patterned photomask comprising photoresist overlying said oxide layer with an etching selectivity to a facet of said photoresist of at least 5:1; and vacuum pumping said chamber to maintain a residence time of said etching gas mixture in said chamber of no more than 70 milliseconds.

8. The method of claim 7, wherein said etching gas mixture contains essentially no carbon monoxide.

9. The method of claim 7, wherein said etching gas mixture additionally comprises carbon monoxide.

10. A method of etching a hole in an oxide layer, comprising the steps of:

providing a magnetically enhanced reactive ion plasma etch reactor;

flowing into said reactor an etching gas mixture comprising a first amount of $C_4F_6$, a second amount of $O_2$, and a third amount of argon and containing essentially no carbon monoxide;

applying a magnetic field in said reactor;

applying RF power to a pedestal electrode supporting a substrate containing said oxide layer to excite said etching gas mixture into a plasma to etch said oxide layer.

11. The method of claim 10, wherein a ratio of said second amount to said first amount is between 0.5:1 and 1.2:1.

12. The method of claim 11, wherein a ratio of said third amount to said first amount is greater than 20.

13. The method of claim 10, further comprising vacuum pumping said reactor to a pressure of at least 40 milliTorr.

14. The method of claim 12, wherein said vacuum pumping step maintains a residence time of said etching gas mixture in said reactor of no more than 70 milliseconds.

15. The method of claim 10, wherein said magnetic field is applied to a level of at least 35 gauss.

16. The method of claim 10, wherein said RF power is applied in an amount between 1650 and 2100W normalized to a 200 mm-diameter wafer.

17. The method of claim 10, wherein said applying step applies said magnetic field in a first step to a level of at least 50 gauss and applies said magnetic field in a second step to a level less than 50 gauss.

18. The method of claim 10, wherein said oxide layer is patterned with a layer of photoresist and wherein said plasma etches said oxide layer selectively to a facet of said photoresist of at least 5:1.

19. The method of claim 10, wherein a first ratio of said second amount to said first amount is between 0.4:1 to 2:1 and wherein a second ratio of said third amount to said first amount is at least 10.

20. The method of claim 1, wherein said magnetic field has a field strength of greater than 35 Gauss.

21. The method of claim 2, wherein said plasma etch reactor is capacitively coupled to form said plasma.

22. The method of claim 2, wherein said fluorocarbon is hydrogen-free.

23. An The method of claim 22, wherein said fluorocarbon comprises $C_4F_6$.

24. The method of claim 2, wherein said first field strength level is greater than 50 Gauss.

25. The method of claim 24, wherein said second field strength level is greater than 35 Gauss.

26. The method of claim 7, wherein said fluorocarbon is hydrogen-free.

27. The method of claim 26, wherein said fluorocarbon comprises $C_4F_6$.

28. The method of claim 7, wherein said magnetic field has a field strength of greater than 35 Gauss.

29. In a magnetically enhanced plasma etch reactor chamber having a pedestal electrode in opposition to a showerhead, a method for etching an oxide layer in a substrate supported on said pedestal electrode in said chamber, comprising two sequentially performed steps each comprising the sub-steps of:

flowing into said chamber through said showerhead an etching gas mixture comprising (a) a fluorocarbon and (b) a chemically inactive carrier gas selected from the group consisting of argon and xenon;

applying a magnetic field adjacent to said pedestal electrode; and applying RF electrical power to said pedestal electrode to excite said etching gas mixture into a plasma to thereby etch a hole into said oxide layer defined by a patterned photomask comprising photoresist overlying said oxide layer;

wherein during a first one of said steps said magnetic field has a first field strength level and during a second one of said steps said magnetic field has a second field strength level less than said first field strength level.

30. The method of claim 29, wherein said magnetic field is substantially parallel to said pedestal electrode.

31. The method of claim 29, wherein said step of applying a magnetic field comprises applying a current to at least one magnetic coil disposed on a side of said showerhead toward said pedestal electrode.

32. The method of claim 31, wherein a plurality of said magnetic coils surround said chamber and cause said magnetic field to rotate and to be substantially parallel to said pedestal electrode.

33. The method of claim 29, wherein said etching gas mixture additionally comprises oxygen.

34. The method of claim 29, wherein said fluorocarbon has at least four carbon atoms and an F/C ratio of less than 2.

35. The method of claim 34, wherein said fluorocarbon comprises hexafluorobutadiene.

36. The method of claim 34, wherein said etching gas mixture additionally comprises oxygen.

37. In a magnetically enhanced plasma etch reactor chamber having a pedestal electrode, a method for etching an oxide layer in a substrate supported on said pedestal electrode in said chamber, comprising two sequentially performed steps each comprising the sub-steps of:
flowing into said chamber an etching gas mixture comprising (a) a fluorocarbon having at least four carbon atoms and an F/C ratio of less than 2, (b) oxygen, and (c) a chemically inactive carrier gas selected from the group consisting of argon and xenon;
applying a magnetic field substantially parallel to said pedestal electrode; and
applying RF electrical power to said pedestal electrode to excite said etching gas mixture into a plasma to thereby etch a hole into said oxide layer defined by a patterned photomask comprising photoresist overlying said oxide layer;
wherein a ratio of a flow of said oxygen to a flow of said fluorocarbon is higher in a first one of said steps than in a second one of said steps.

38. The method of claim 37, wherein said fluorocarbon is hydrogen-free.

39. The method of claim 38, wherein said fluorocarbon comprises $C_4F_6$.

40. The method of claim 37, wherein said fluorocarbon comprises $C_5F_8$.

41. The method of claim 26, wherein said fluorocarbon comprises $C_5F_8$.

42. The method of claim 34, wherein said fluorocarbon comprises $C_5F_8$.

43. A method for etching an oxide layer, comprising the steps of:
providing a magnetically enhanced plasma etch reactor chamber having a pedestal electrode supporting in opposition to a showerhead a substrate having said oxide layer to be etched;
flowing through said showerhead into said chamber an etching gas comprising (a) a fluorocarbon selected from the group consisting of $C_4F_6$, $C_5F_8$, and $C_6F_6$, (b) oxygen, and (c) a chemically inactive carrier gas selected from the group consisting of argon and xenon, said etching gas including essentially no CO;
applying a magnetic field parallel to said pedestal electrode; and
applying RF electrical power to said pedestal electrode to excite said etching gas mixture into a plasma to thereby etch a hole into said oxide layer defined by a patterned photomask overlying said oxide layer.

44. The method of claim 43, wherein said photomask comprises photoresist and wherein said plasma of said etching gas mixture etches said oxide layer with an etching selectivity to said photoresist of at least 5:1.

45. The method of claim 43, wherein said fluorocarbon comprises $C_4F_6$.

46. The method of claim 43, wherein said fluorocarbon comprises $C_5F_8$.

47. The method of claim 43:
wherein at least one magnetic coil is disposed on a side of said showerhead towards said pedestal electrode; and
a wherein said step of applying said magnetic field comprises powering said magnetic coil.

* * * * *